United States Patent [19]

Mayer

[11] 4,405,229
[45] Sep. 20, 1983

[54] METHOD OF PROJECTING PRINTING ON SEMICONDUCTOR SUBSTRATE AND WORKPIECE INCLUDING SUCH SUBSTRATE

[75] Inventor: Herbert E. Mayer, Eschen, Austria

[73] Assignee: Censor Patent- und Versuchs-Anstalt, Vaduz, Liechtenstein

[21] Appl. No.: 265,549

[22] Filed: May 20, 1981

[51] Int. Cl.³ ............................................. G03B 27/32
[52] U.S. Cl. ...................................... 355/77; 355/44; 355/53; 355/125
[58] Field of Search ...................... 355/53, 71, 77, 44, 355/45, 125

[56] References Cited

U.S. PATENT DOCUMENTS 3,771,872 11/1973 Nightingale et al. ............... 355/125
3,816,223 6/1974 Ahn et al. ........................ 355/125 X Primary Examiner—Richard A. Wintercorn
Attorney, Agent, or Firm—Karl F. Ross

[57] ABSTRACT

In the projection-copying of a mask on a workpiece including a light-reflecting semiconductor substrate, the alignment of mask and workpiece is effected by illuminating marks on the substrate which appear dark relative to a surrounding area. To provide each mark with a contrasting background of sufficient brightness, a partly reflecting surface layer overlying the substrate in that area has a nonuniform optical thickness whereby cancellation of reflections due to interference is limited to isolated regions.

7 Claims, 13 Drawing Figures

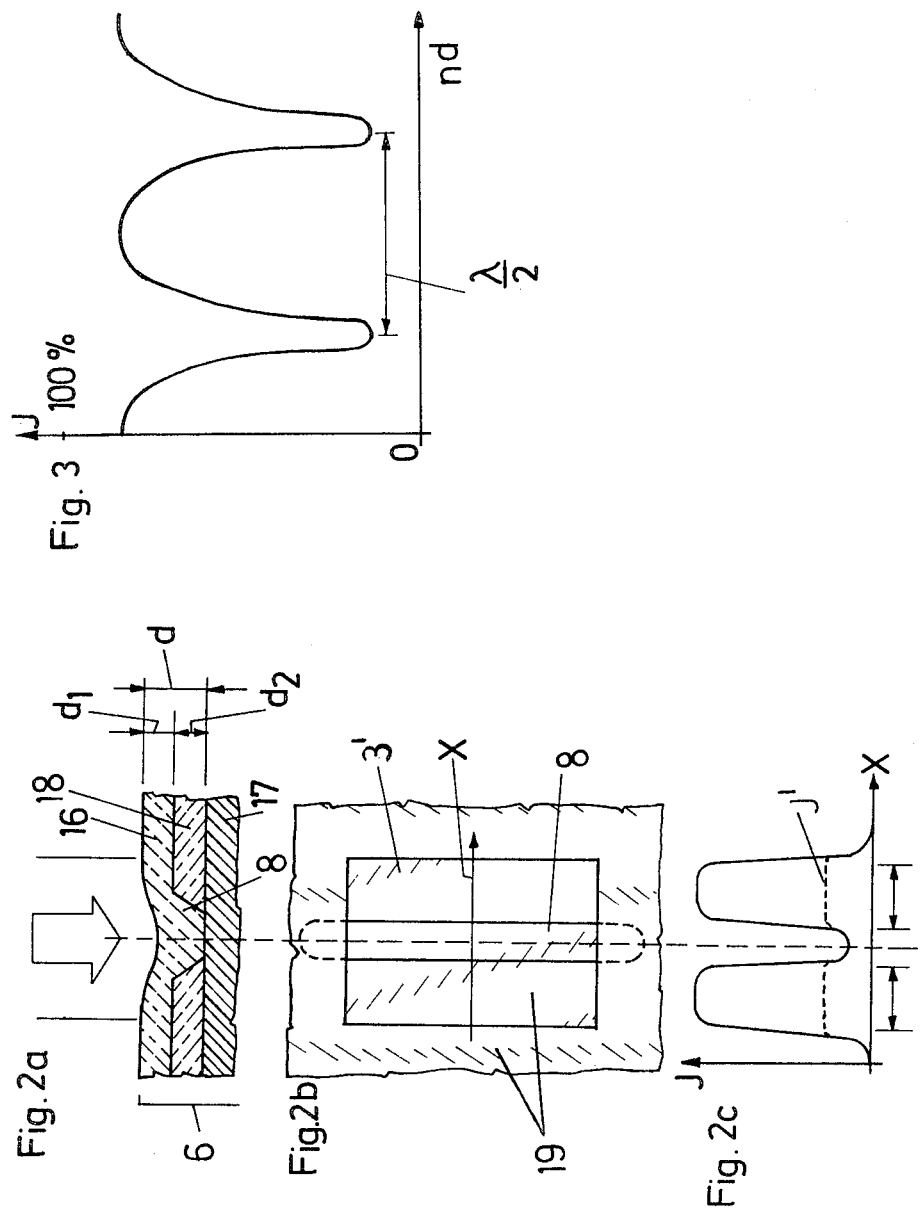

METHOD OF PROJECTING PRINTING ON SEMICONDUCTOR SUBSTRATE AND WORKPIECE INCLUDING SUCH SUBSTRATE

FIELD OF THE INVENTION

My present invention relates to the projection copying of photomask patterns on a workpiece, particularly one comprising a semiconductor substrate for the production of integrated circuits, by a method in which the mask patterns are imaged on a photosensitive layer of the workpiece by means of exposure light directed through a projection lens. Prior to the exposure of a workpiece, reference markings of the photomask and correlated adjustment marks of the workpiece are aligned relatively to one another by jointly imaging same on a receiving surface by means of alignment light reflected from the workpiece; the adjustment marks proper appear dark in the alignment light within a relatively bright area.

BACKGROUND OF THE INVENTION

If the substrate used to produce integrated circuits already contains circuit elements, the relative alignment of mask and workpiece prior to the copying process must take the positions of these earlier-formed elements into account. The aforementioned reference markings may have, for example, the shape of transparent elongate windows whereas the associated adjustment marks may each comprise a linear groove in an $SiO_2$ layer overlying the semiconductor substrate. The reference markings may include two pairs of such windows with major dimensions extending in mutually orthogonal directions. Upon proper alignment, light reflected from the workpiece images respective grooves in the windows of the mask.

Most visual-manual alignment methods employ polychromatic light as the alignment illumination. In such case, the light source is an incandescent lamp or a xenon lamp so that the spectrum of the alignment light ranges from about 500 nm into infrared. Alignment methods employing polychromatic light have, however, a number of disadvantages. In view of the fact that the image efficiency of projection lenses is greater when a beam of monochromatic light is used, most automatic alignment methods employ light having a relatively narrow spectrum (on the order of magnitude of some nm).

One of these prior-art systems uses for the alignment process the exposure light source, which is generally a mercury-vapor lamp. Either the narrow spectral range around 547 nm or that around 436 nm will then be used as the alignment light.

Still, a problem arises in this connection. If the alignment process is carried out by means of light at 436 nm, its intensity must be very low inasmuch as a photosensitive layer overlying the axial layer on the semiconductor disk is highly absorbent of and sensitive to wavelengths of less than 500 nm. That photosensitive layer should, however, not be pre-exposed by the alignment light.

This problem may be solved by using a separate alignment light source with a narrow spectrum or by changing to the higher spectral range around 547 nm. Apart from the costs of a separate alignment light source, the restriction to a precise alignment wavelength frequently creates a disadvantageous effect. Thus, because of interference phenomena, not only the actual mark but also its surroundings appear dark to the viewer so that the mark disappears or is visible only with inadequate contrast. The aforementioned interference phenomena are due to the fact that a semiconductor substrate employed for the production of integrated circuits is optically comparable to a reflective body of silicon coated with a partially reflective layer of silicon dioxide and a photoresist. In spite of the fact that the layer thicknesses are a multiple of the alignment wavelength, the light rays reflected by the first and second boundaries are extinguished by interference because of the great coherency length of the alignment light.

OBJECTS OF THE INVENTION

It is, therefore, the general object of my present invention to provide an improved method for the projection copying of masks, particularly on a semiconductor substrate, by which—in a manner largely independent of the layer combination on the semiconductor substrate—a high-intensity and high-contrast adjustment signal is provided for aligning the mask and the workpiece with each other.

A related object is to provide a workpiece particularly suitable for the practice of this method.

SUMMARY OF THE INVENTION

The workpiece to be imprinted with the configuration of the mask, in accordance with my present invention, has a light-reflecting substrate of semiconductor material (generally silicon) covered by a partly reflective layer including a photosensitive coating. An adjustment mark provided in that layer has the form of a discontinuity which, by its shape, significantly reduces the reflection of monochromatic light impinging thereon. In an area immediately surrounding that discontinuity, whose top surface is flat, the layer is of nonuniform thickness with at least two values differing by other than a multiple of half a wavelength—preferably by an odd multiple of quarter wavelengths—of the incident light; this insures that, regardless of the absolute thickness, there will be at least some parts of the surrounding area in which the light reflected at the layer surface and light reflected at the underlying substrate surface will not be in mutual phase opposition and which therefore will provide a contrasting background for the adjustment mark.

If the nonuniform layer thickness in the vicinity of an adjustment mark varies continuously rather than in steps, which is more convenient with existing manufacturing techniques, I prefer to extend the range of variation to at least half the wavelength of the incident light; this insures that, at certain points, the impinging light rays will be cophasally reflected at the layer and substrate surfaces for maximum brightness.

BRIEF DESCRIPTION OF THE DRAWING

The above and other features of my invention will now be described in detail with reference to the accompanying drawing in which:

FIG. 2a is an enlarged sectional view of part of a workpiece, used in the system of FIGS. 1 and 1a, in the region of an alignment mark;

FIG. 2b is a corresponding top view;

FIG. 2c is a graph illustrating the resultant alignment signal;

FIG. 3 is a graph representing the intensity of the light reflected from the vicinity of the mark as a function of the optical thickness of a partially reflective cover layer of the workpiece;

FIGS. 4b and 4c are cross-sectional views respectively taken along lines B—B and C—C in FIG. 4a.

SPECIFIC DESCRIPTION

Figure 1:
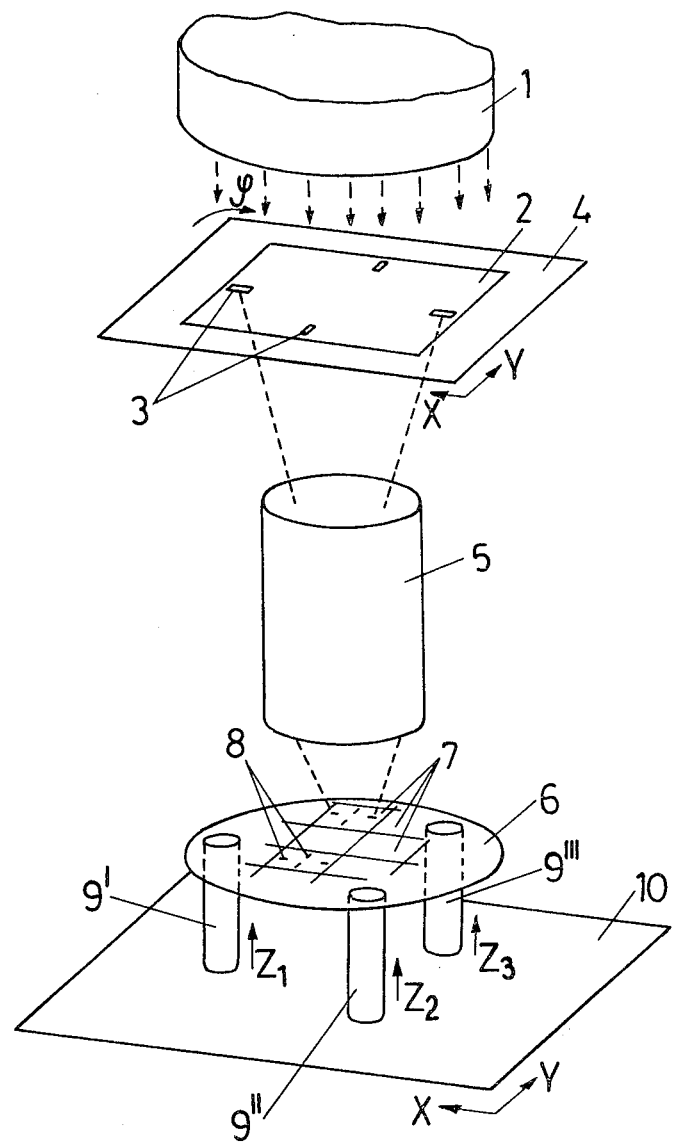
FIG. 1 shows in an oblique view the conventional disposition of the most significant elements of a projection-copying arrangement for the production of integrated circuits.

FIG. 1 shows the essential components of a projection-copying arrangement for the manufacture of integrated circuits. The system consists essentially of an exposure device 1, a mask stage 4, a projection objective 5 and a coordinate table 10. A photomask 2 to be imaged rests on stage 4 in the object plane of the projection objective 5 while a disk-shaped workpiece 6 is disposed in the image plane thereof on three shifting devices 9', 9" and 9"' adapted to elevate the disk at different locations as indicated by arrows $Z_1$, $Z_2$ and $Z_3$.

The coordinate table 10 is movable in known manner for the stepwise displacement of the workpiece 6 in order to image the circuit pattern of the mask 2 in consecutive steps on predetermined areas 7 according to the step-and-repeat process. In order to be able to perform before each imaging an exact alignment between workpiece 6 and mask 2 relative to the projection apparatus, reference markings 3 and correlated adjustment marks 8 are allocated to the areas 7 on the workpiece. According to the occurring alignment errors, the mask stage 4 may be shifted, for example, in cartesian and angular coordinates XY and $\phi$ of the object plane, and the workpiece 6 can be shifted along the optical axis of the system. In order to be able to execute an angularly precise alignment of the disk 6 in the image plane of the projection objective 5, the three shifting devices 9', 9" and 9"' are separately controllable.

Figure 1A:
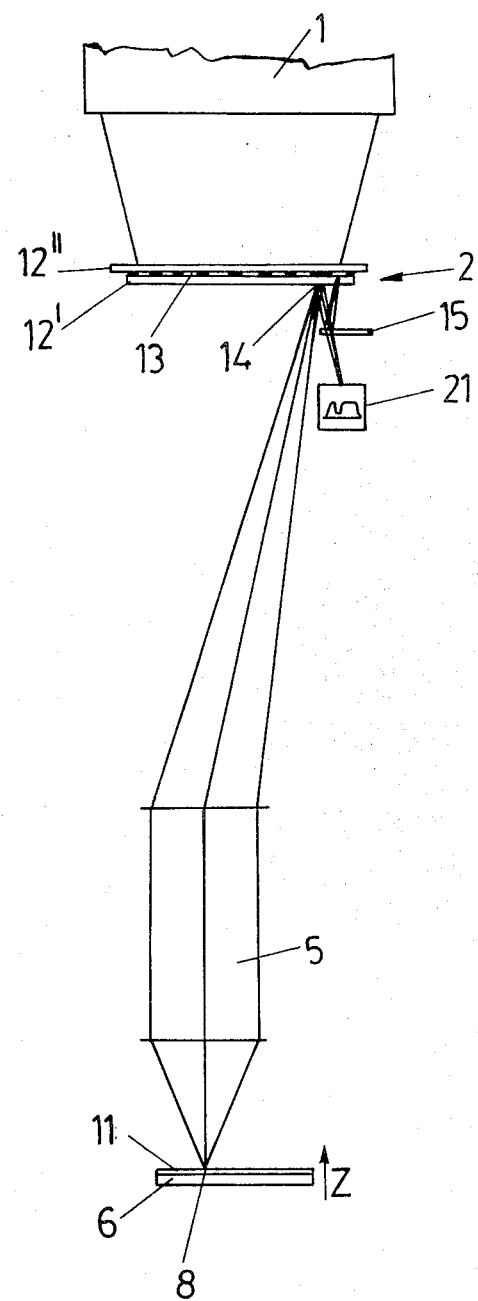
FIG. 1a is a diagram of a ray path for the joint imaging of an adjustment mark and a reference marking on a receiving surface as likewise known per se.

FIG. 1a schematically shows the means necessary for the determination of alignment errors. The mask 2 consists of two glass panes 12' and 12" between which a masking layer 13 is disposed. The rays impinging from the exposure device 1 upon a reference marking 3, designed as a slot-shaped window with at least two parallel edges, are reflected by a semitransparent mirror 15 disposed below the mask 2 and are focused by the objective 5 upon the area of the associated adjustment mark 8 of the workpiece 6 via a mirror 14 provided on the underside of pane 12'. The image 3' (FIG. 2b) of the window 3 on the upper workpiece surface and the adjustment mark 8 are retroprojected by the objective 5 and are cast by the reflector 14 through the semitransparent mirror 15 onto a receiving surface of an evaluating device 21.

In FIG. 2a a common layer structure of the workpiece 6 in the area of an adjustment mark 8 has been illustrated. The workpiece 6 consists of a main body or substrate 17 of silicon, overlain by an $SiO_2$ layer 18. The linear adjustment mark 8 is formed as a groove in the $SiO_2$ layer. The semiconductor substrate 17 and its oxide film 18 are fully covered by a photosensitive layer or photoresist 16 onto which the circuit pattern of the mask is to be transferred. As the optical characteristics of the photosensitive layer 16 of thickness $d_1$ and of the $SiO_2$ layer 18 of thickness $d_2$ are similar, the workpiece 6 can be defined as a reflective substrate 17 covered by a partly reflective composite layer of thickness $d = d_1 + d_2$ having a reflection-reducing discontinuity 8. A high-intensity and high-contrast adjustment signal can be obtained only if the composite layer of thickness d disposed on the semiconductor substrate 17 is of sufficient reflectivity in the vicinity of the adjustment mark 8, i.e. if the condition for additive interference has been fulfilled in at least part of the surrounding area. This condition is $d = j \cdot (\lambda/2n)$, j being an integer, $\lambda$ being the wavelength of the alignment light in vacuum and n being the refractive index of the layer. In other words, the intensity of the alignment light reflected from the workpiece will be a maximum if the layer thickness d is an even-numbered multiple of half the wavelength of that light.

The alignment light reflected from the workpiece will be substantially attenuated if the layer thickness d satisfies the following formula: $d = (2j+1) \cdot (\lambda/4n)$.

As can readily be seen in FIG. 3, the interference condition for an attenuation of the alignment light reflected from the workpiece recurs periodically as a function of layer thickness d (period = $\lambda/2n$). An attenuation of the alignment light reflected from the workpiece creates at the same time an undesired reduction of the contrast between discontinuity 8 and its surroundings 19. If the alignment light reflected from the workpiece is attenuated to a high degree, a signal J' (dotted line) is produced instead of the ideal intensity profile J as shown in FIG. 2c.

Figure 4A:
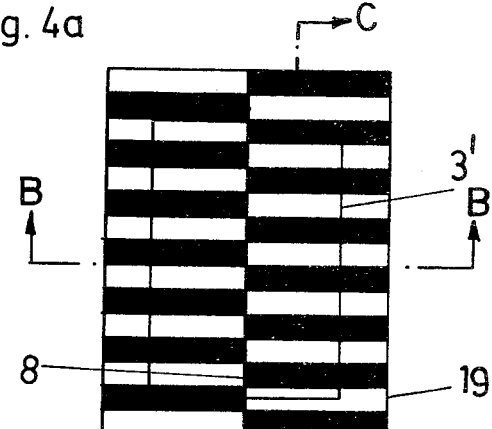
FIG. 4a is a top view of a particularly advantageous mark configuration.

In order to eliminate this adverse effect, care should be taken in accordance with my invention that the area 19 immediately surrounding the actual mark 8 includes regions of different optical thicknesses which do not deviate from one another by half the wavelength of the incident light. As illustrated in FIG. 4a, the regions differing in optical thickness may be a multiplicity of parallel strip zones formed by alternating ribs and grooves of oxide film 18 transverse to adjustment mark 8. If the ribs are, as illustrated, relatively staggered in the longitudinal direction of the adjustment mark 8, the linear discontinuity representing that mark is defined by the mutually offset, oppositely sloping narrow edges of the ribs as can be more clearly seen in FIG. 4b; thanks to the light-scattering effect of these edges, the adjustment mark 8 appears dark in the reflected light. The cross-sectional view illustrated in FIG. 4b also shows the thickness difference $\Delta d$ on account of which the individual stripes seen in FIG. 4a appear alternately bright and dark. Thus, the surface of the reflective silicon disk 17 is not uniformly spaced from the substantially planar top surface of the photosensitive layer 16. The intervening $SiO_2$ layer 18 is of varying thickness and fills the troughs in the silicon disk 17. The difference $\Delta d$ in the thickness of the semireflective layer 16, 18 on the left side and on the right side in the plane of FIG. 4b insures that extinction conditions are never simultaneously satisfied at the left and right sides. As can be seen in FIG. 4c, this is also true for stripes which succeed one another in the longitudinal direction of the adjustment mark 8.

If the lowered and raised zones of substrate 17 and layer 18 merge more or less continuously into one another, as illustrated in FIG. 4c, the probability to find any intermediate value of the optical thickness—including one that satisfies the optimum-reflection condition $d=j\lambda/2n$—is substantially the same for all such values. In order to exclude the possibility of a simultaneous light attenuation in the entire surroundings 19, the amplitude of the variation in thickness shall in such case be at least equal to half the wavelength of the alignment light. If, however, individual planar zones of the substrate are separated from one another by sloping flanks whose optical influence is small, I prefer to separate their individual levels by a vertical distance $\Delta d$ corresponding to a quarter of the wavelength of the alignment light or to an odd multiple thereof.

The application of an adjustment mark, as shown in FIG. 4a, is illustrated in FIGS. 5a–5d.

Figure 5A:
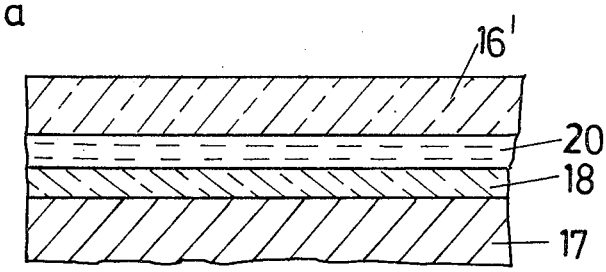
FIGS. 5a through 5d show the essential steps of the corresponding manufacturing process.
Figure 5B:
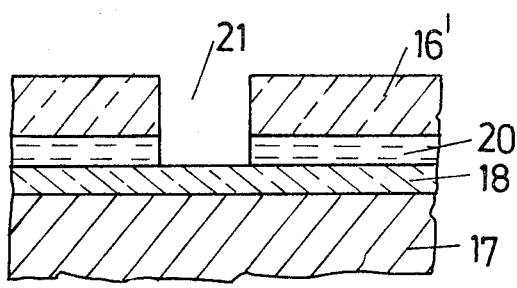
Figure 5C:
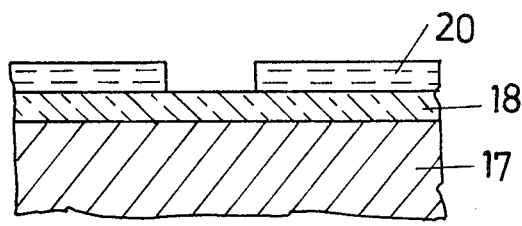
Figure 5D:
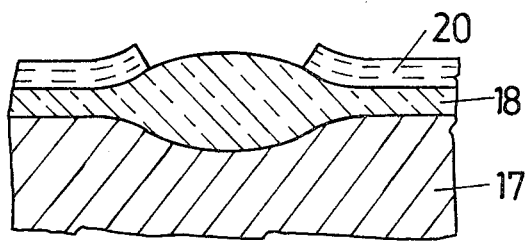

First, a substrate 17 of silicon is provided with an $SiO_2$ layer 18, having a thickness between about 60 and 80 nm, by means of chemical oxidation. A layer 20 of silicon nitride ($Si_3N_4$), which also has a thickness of about 80 nm, is deposited thereon from the vapor phase. A photoresist layer 16 is disposed on layer 20 as shown in FIG. 5a. When the top layer 16 is exposed to light in the region 21, it can be removed from the stack whereupon the subjacent part of layer 20 can be etched off, as can be seen in FIG. 5b. Then the residue of photoresist coating 16' is removed so that the situation illustrated in FIG. 5c is produced. After oxidation in a furnace, the intermediate product illustrated in FIG. 5d is obtained. The oxide film 18 lying between layer 20 and substrate 17 has a thickness of about 1 μm. During oxidation the intrusion of oxygen has been prevented in the areas covered by the protective layer 20 of silicon nitride. This process is called local oxidation of silicon (locos). The bending-up of the silicon nitride layer 20 at the edges of the additionally oxidized areas is typical of this process and is caused by the swelling of the silicon dioxide layer 18 because oxygen diffuses toward the inside and silicon diffuses toward the outside.

Figure 4B:
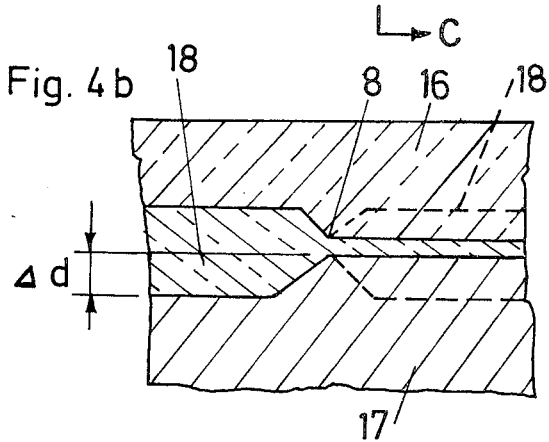
Figure 4C:
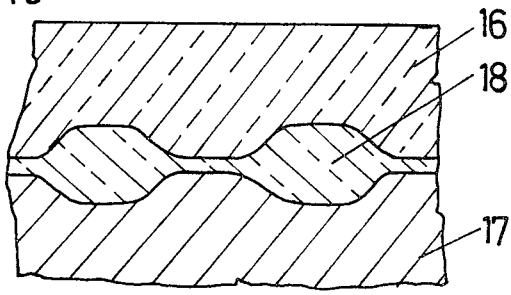

The product described in detail with reference to FIGS. 4a–4c is obtained by etching off the residual layer 20 and coating the workpiece again with a photosensitive layer 16 as shown in FIGS. 4b and 4c; naturally, my invention is in no way limited to the striped configuration whose top view has been illustrated in FIG. 4a.

What is claimed is:

1. A method of facilitating the alignment of a photomask with a workpiece onto which the pattern of the photomask is to be imaged for projection printing, said workpiece including a light-reflecting substrate overlain by a partly reflecting layer of photosensitive character, comprising the steps of:
    (a) providing a reference marking on said photomask;
    (b) providing an adjustment mark correlated with said reference marking on said workpiece, said adjustment mark being a reflection-reducing discontinuity in said layer;
    (c) making the thickness of said layer nonuniform in an area immediately surrounding said discontinuity while maintaining the top surface of said layer substantially planar in said area; and
    (d) jointly illuminating said adjustment mark and said reference marking with monochromatic light of a predetermined wavelength for simultaneously imaging same on a receiving surface, said thickness having at least two values differing by other than a multiple of half said wavelength to provide a contrasting background for said adjustment mark.

2. A method as defined in claim 1 wherein said values differ from each other by substantially an odd multiple of a quarter of said wavelength.

3. A method as defined in claim 1 wherein said thickness varies continuously between limiting values differing from each other by at least half said wavelength.

4. A method as defined in claim 1, 2 or 3 wherein said substrate is silicon body and said layer consists of a film of silicon dioxide covered by a photosensitive coating, the nonuniformity of the layer thickness being produced by local oxidation of the substrate prior to deposition of said photosensitive coating.

5. A method as defined in claim 1, 2 or 3 wherein said area is divided into parallel strip zones in which the thickness of said layer alternates between high and low values.

6. A method as defined in claim 5 wherein said discontinuity extends along a straight line, said strip zones being disposed perpendicular to said line.

7. A workpiece for implementing the method of claim 1, 2 or 3, comprising a silicon disk constituting the light-reflecting substrate, a film of silicon dioxide on said disk and a photosensitive coating on said film, said coating and said film having similar optical characteristics and together constituting the partly reflecting layer, said film having a linear discontinuity constituting the adjustment mark, the thickness of said film being nonuniform in the immediate vicinity of said discontinuity, the top surface of said coating being substantially flat in said vicinity.

* * * * *

Dedication 4,405,229.—*Herbert E. Mayer*, Eschen, Austria. METHOD OF PROJECTING ON SEMICONDUCTOR SUBSTRATE AND WORKPIECE INCLUDING SUCH SUBSTRATE. Patent dated Sept. 20, 1983. Dedication filed Feb. 20, 1990, by the assignee, Mercotrust Aktiengesellschaft.

Hereby dedicates to the Public the remaining term of said patent.
[ *Official Gazette April 17, 1990* ]